(12) United States Patent
Chen et al.

(10) Patent No.: US 12,504,693 B2
(45) Date of Patent: Dec. 23, 2025

(54) PHOTORESIST COMPOSITION AND METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: Yen-Hao Chen, New Taipei (TW); Wei-Han Lai, New Taipei (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 658 days.

(21) Appl. No.: 17/168,145

(22) Filed: Feb. 4, 2021

(65) Prior Publication Data
US 2021/0271164 A1    Sep. 2, 2021

Related U.S. Application Data

(60) Provisional application No. 62/982,709, filed on Feb. 27, 2020.

(51) Int. Cl.
*G03F 7/38* (2006.01)
*C08J 3/24* (2006.01)
(Continued)

(52) U.S. Cl.
CPC ............ *G03F 7/38* (2013.01); *C08J 3/24* (2013.01); *G03F 7/038* (2013.01); *G03F 7/039* (2013.01);
(Continued)

(58) Field of Classification Search
CPC .... G03F 7/0392; G03F 7/0397; G03F 7/0382; G03F 7/30; G03F 7/36; G03F 7/38; G03F 7/40
See application file for complete search history.

(56) References Cited

U.S. PATENT DOCUMENTS 5,650,261 A * 7/1997 Winkle ................ G03F 7/0045
                                                        430/196
6,114,085 A * 9/2000 Padmanaban ........... G03F 7/091
                                                        430/271.1
(Continued)

FOREIGN PATENT DOCUMENTS

| TW | 201420611 A | 6/2014 |
|---|---|---|
| TW | 201936613 A | 9/2019 |
| TW | 202001993 A | 1/2020 |

OTHER PUBLICATIONS

Akimasa Soyano, "Application of Polymers to Photoresist Materials," J-Stage, vol. 85, Issue 2, pp. 33-39; https://doi.org/10.2324/gomu.85.33.
(Continued)

*Primary Examiner* — John S. Chu
(74) *Attorney, Agent, or Firm* — STUDEBAKER BRACKETT PLLC

(57) ABSTRACT

Manufacturing method includes forming photoresist layer including photoresist composition over substrate. Photoresist composition includes: photoactive compound, polymer, crosslinker. The polymer structure
(Continued)

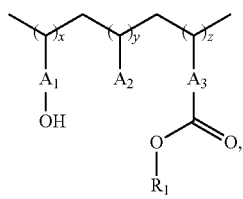

A1, A2, A3 independently C1-C30 aryl, alkyl, cycloalkyl, hydroxylalkyl, alkoxy, alkoxyl alkyl, acetyl, acetylalkyl, carboxyl, alky carboxyl, cycloalkyl carboxyl, hydrocarbon ring, heterocyclic, chain, ring, 3-D structure; R1 is C4-C15 chain, cyclic, 3-D structure alkyl, cycloalkyl, hydroxylalkyl, alkoxy, or alkoxyl alkyl; proportion of x, y, and z in polymer is $0 \leq x/(x+y+z) \leq 1$, $0 \leq y/(x+y+z) \leq 1$, and $0 \leq z/(x+y+z) \leq 1$, x, y, and z all not 0 for same polymer. Crosslinker is monomer, oligomer, polymer including structures

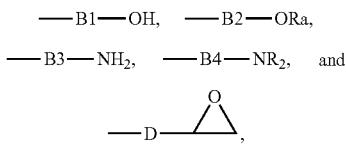

B1, B2, B3, B4, and D each independently C1-C30 aryl, alkyl, cycloalkyl, hydroxylalkyl, alkoxy, alkoxyl alkyl, acetyl, acetylalkyl, carboxyl, alky carboxyl, cycloalkyl carboxyl, hydrocarbon ring, heterocyclic group, chain, ring, 3-D structure; R2 and Ra are C4-C15 chain, cyclic, 3-D structure alkyl, cycloalkyl, hydroxylalkyl, alkoxy, alkoxyl alkyl.

20 Claims, 12 Drawing Sheets

(51) Int. Cl.
| | | |
|---|---|---|
| *G03F 7/038* | (2006.01) | |
| *G03F 7/039* | (2006.01) | |
| *G03F 7/30* | (2006.01) | |
| *G03F 7/36* | (2006.01) | |
| *G03F 7/40* | (2006.01) | |
| *H01L 21/027* | (2006.01) | |

(52) U.S. Cl.
CPC .............. *G03F 7/30* (2013.01); *G03F 7/36* (2013.01); *G03F 7/40* (2013.01); *H01L 21/0274* (2013.01); *C08J 2325/02* (2013.01); *C08J 2325/14* (2013.01); *C08J 2325/18* (2013.01); *C08J 2333/08* (2013.01)

(56) References Cited

U.S. PATENT DOCUMENTS

| | | | | |
|---|---|---|---|---|
| 6,136,500 A | * | 10/2000 | Kobayashi | G03F 7/0382 |
| | | | | 430/921 |
| 7,799,506 B2 | * | 9/2010 | Hirano | G03F 7/0397 |
| | | | | 430/326 |
| 8,796,666 B1 | | 8/2014 | Huang et al. | |
| 9,093,530 B2 | | 7/2015 | Huang et al. | |
| 9,213,234 B2 | | 12/2015 | Chang | |
| 9,223,220 B2 | | 12/2015 | Chang | |
| 9,256,133 B2 | | 2/2016 | Chang | |
| 9,536,759 B2 | | 1/2017 | Yang et al. | |
| 9,548,303 B2 | | 1/2017 | Lee et al. | |
| 9,857,684 B2 | | 1/2018 | Lin et al. | |
| 9,859,206 B2 | | 1/2018 | Yu et al. | |
| 9,875,892 B2 | | 1/2018 | Chang et al. | |
| 2001/0035394 A1 | * | 11/2001 | Takeda | G03F 7/0045 |
| | | | | 216/41 |
| 2002/0076643 A1 | * | 6/2002 | Ohsawa | G03F 7/0045 |
| | | | | 430/311 |
| 2002/0077493 A1 | * | 6/2002 | Ohsawa | G03F 7/0045 |
| | | | | 558/47 |
| 2009/0104559 A1 | * | 4/2009 | Houlihan | C07C 55/08 |
| | | | | 562/583 |
| 2014/0141375 A1 | * | 5/2014 | Cho | G03F 7/038 |
| | | | | 430/296 |
| 2014/0141376 A1 | * | 5/2014 | Cho | G03F 7/2004 |
| | | | | 430/287.1 |
| 2018/0009775 A1 | * | 1/2018 | Tanaka | C07D 307/52 |
| 2020/0017441 A1 | * | 1/2020 | Zhang | G03F 7/0048 |

OTHER PUBLICATIONS

Shinji Kobayashi et al., "EUV resist outgassing quantification and application," Proc. SPIE 7273, Advances in Resist Materials and Processing Technology XXVI, 72731P (Apr. 1, 2009); <https://doi.org/10.1117/12.813362>.

* cited by examiner

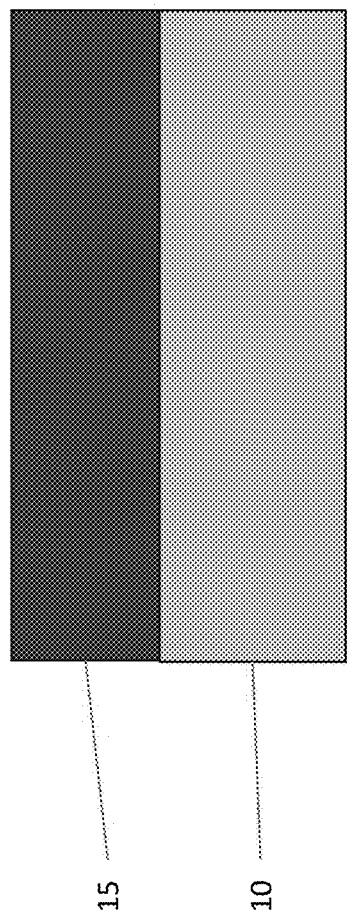

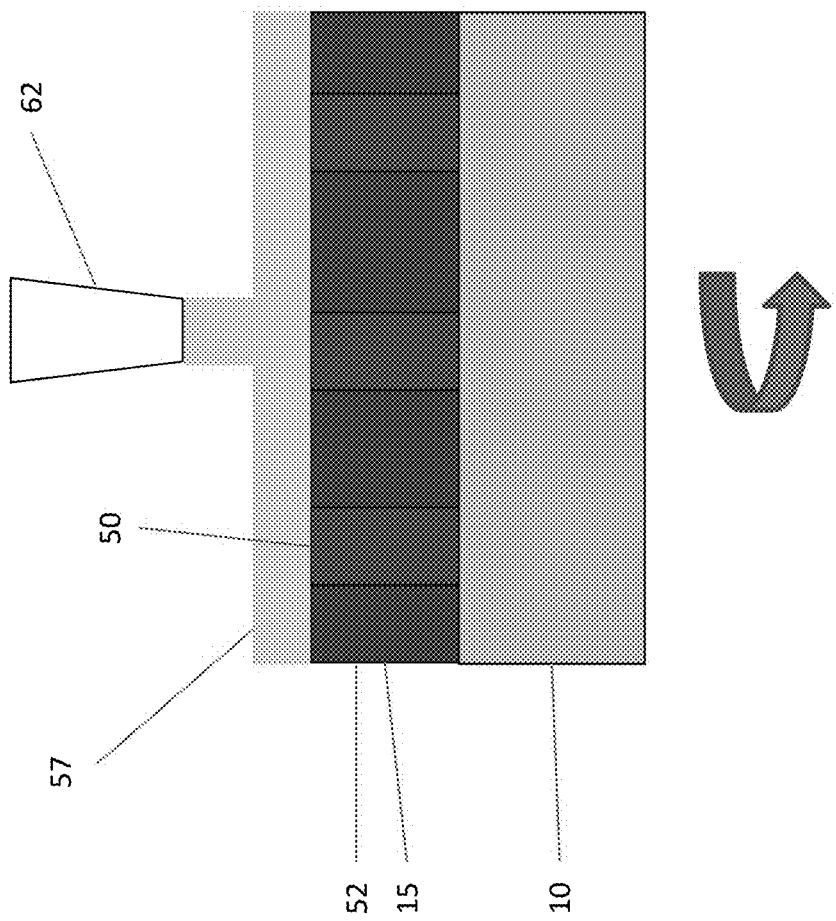

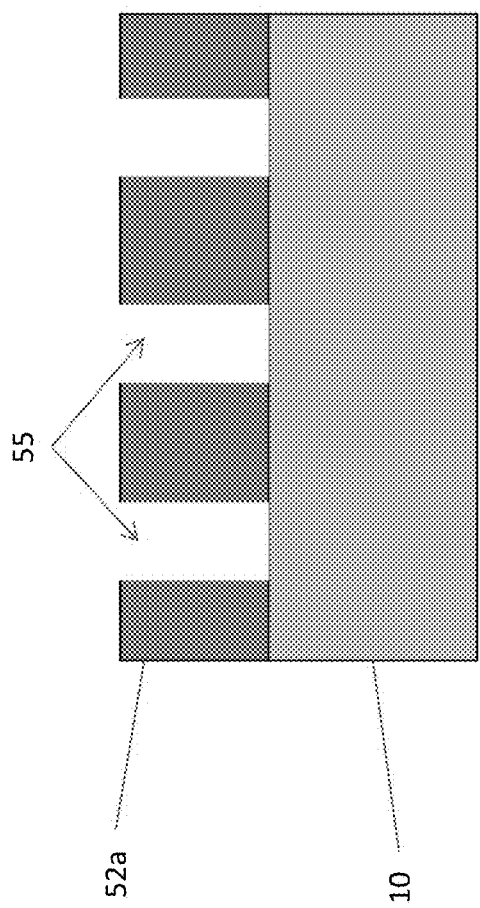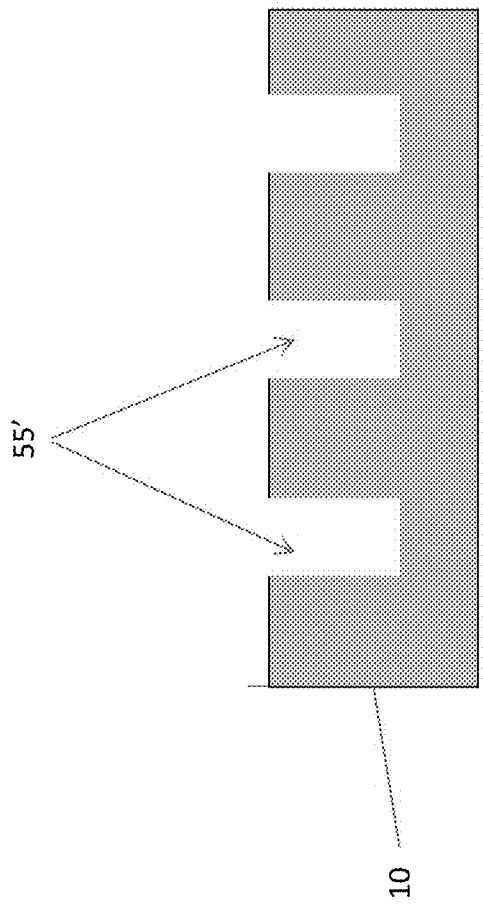

PHOTORESIST COMPOSITION AND METHOD OF MANUFACTURING A SEMICONDUCTOR DEVICE

CROSS-REFERENCE TO RELATED APPLICATION

This application claims priority to U.S. Provisional Patent Application No. 62/982,709, filed Feb. 27, 2020, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL an increase in wafer exposure throughput is desirable. Wafer exposure throughput can be improved through increased exposure power or increased resist photospeed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2 shows a process stage of a sequential operation according to an embodiment of the disclosure.

FIG. 4 shows a process stage of a sequential operation according to an embodiment of the disclosure.

FIG. 5 shows a process stage of a sequential operation according to an embodiment of the disclosure.

FIG. 6 shows a process stage of a sequential operation according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
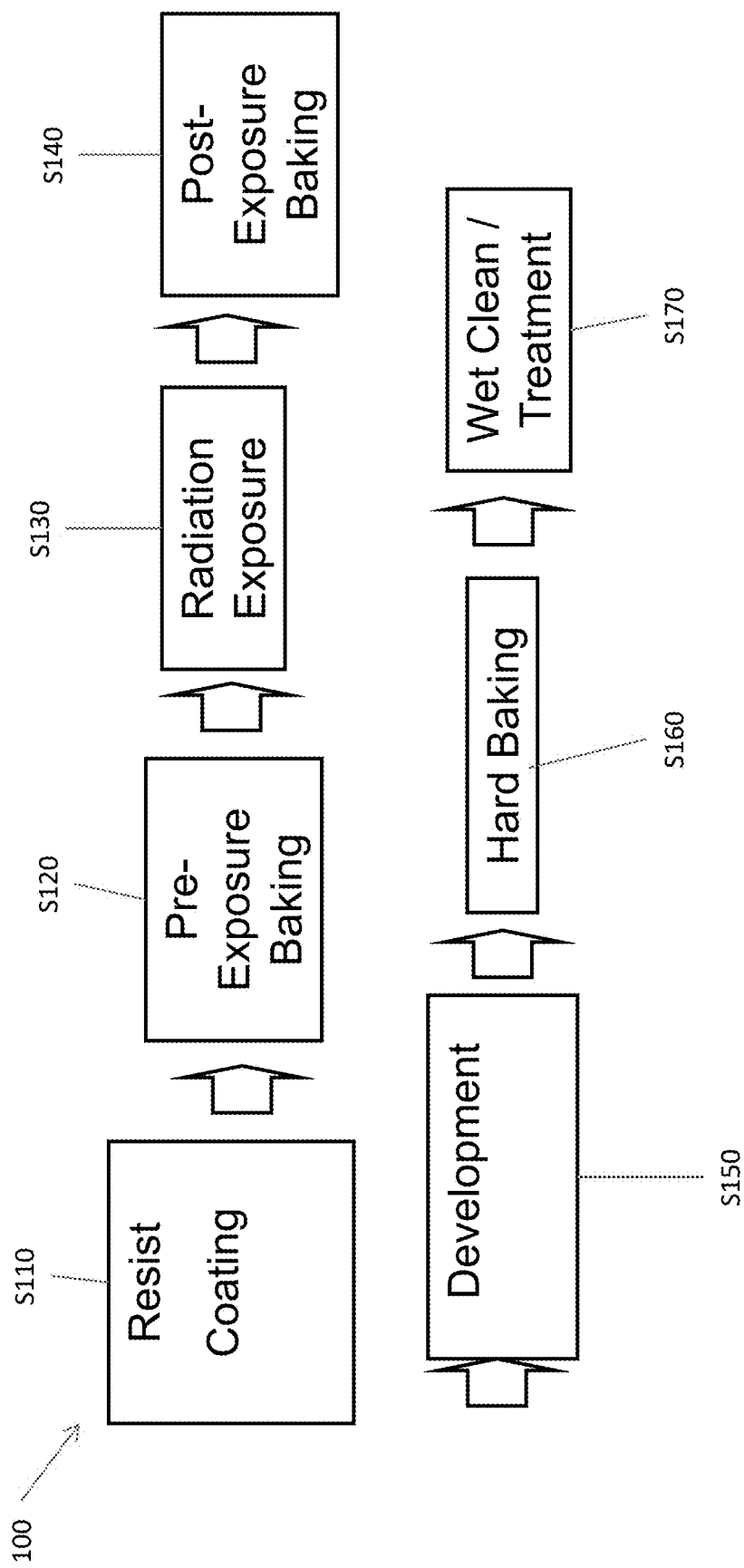
FIG. 1 illustrates a process flow of manufacturing a semiconductor device according to embodiments of the disclosure.

FIG. 1 illustrates a process flow 100 of manufacturing a semiconductor device according to embodiments of the disclosure. A photoresist composition is coated on a surface of a layer to be patterned or a substrate 10 in operation S110, in some embodiments, to form a photoresist layer 15, as shown in FIG. 2. Then the photoresist layer 15 undergoes a first baking operation S120 (pre-exposure baking) to evaporate solvents in the photoresist composition in some embodiments. The photoresist layer 15 is baked at a temperature and time sufficient to cure and dry the photoresist layer 15. In some embodiments, the photoresist layer 15 is heated to a temperature of about 40° C. to 120° C. for about 10 seconds to about 10 minutes. Heating at temperatures below the disclosed ranges or for less the than disclosed time duration may result in insufficient solvent removal from the photoresist layer. Heating at temperatures above the disclosed range or for longer than the disclosed time duration may result in deleterious chemical reactions in the photoresist layer. In some embodiments, the photoresist layer 15 thickness ranges from about 10 nm to about 300 nm. In some embodiments, the photoresist layer 15 has a thickness of less than 75 nm. In some embodiments, the thickness of the photoresist layer 15 ranges from about 25 nm to about 75 nm, in other embodiments, the thickness of the photoresist layer ranges from about 40 nm to about 65 nm. Thicknesses of the photoresist layer less than the disclosed ranges may result in insufficient photoresist coverage of the subsequently formed photoresist pattern. Thicknesses of the photoresist layer greater than the disclosed range may result in unnecessarily thick photoresist layers, higher cost of the photoresist material, and reduced pattern resolution.

After the first baking operation S120, the photoresist layer 15 is selectively exposed to actinic radiation 45/97 (see FIGS. 3A and 3B) in operation S130. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the radiation is an electron beam.

Figure 3A:
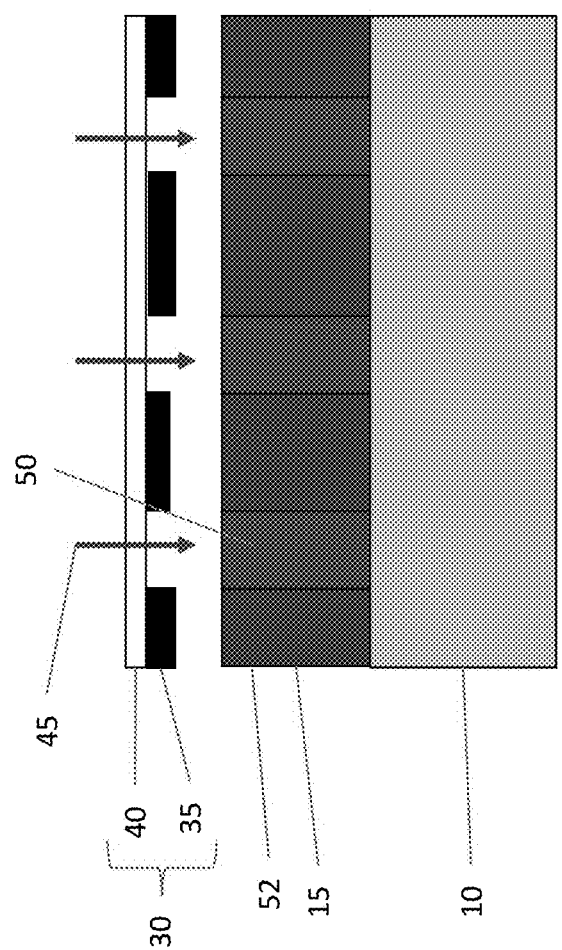
FIGS. 3A and 3B show a process stage of a sequential operation according to an embodiment of the disclosure.

As shown in FIG. 3A, the exposure radiation 45 passes through a photomask 30 before irradiating the photoresist layer 15 in some embodiments. In some embodiments, the photomask 30 has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
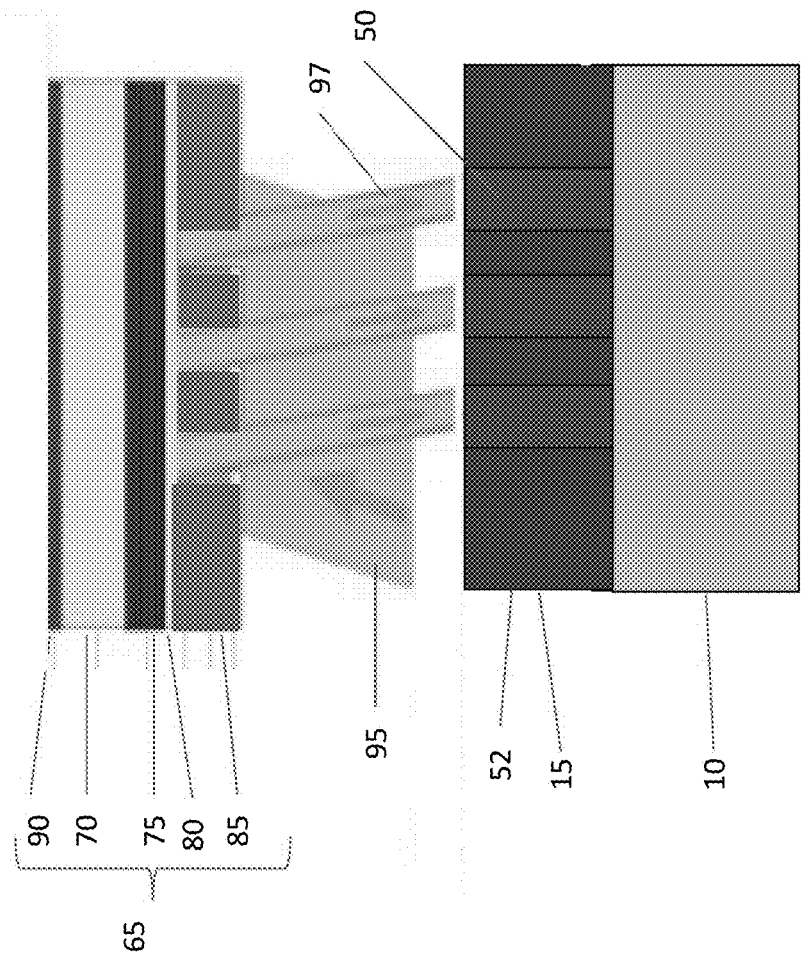

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

The region of the photoresist layer exposed to radiation 50 undergoes a chemical reaction thereby changing its solubility in a subsequently applied developer relative to the region of the photoresist layer not exposed to radiation 52.

Next, the photoresist layer 15 undergoes a post-exposure bake (PEB) (or second baking) in operation S140. In some embodiments, the photoresist layer 15 is heated at a temperature of about 50° C. to 160° C. for about 20 seconds to about 120 seconds. The post-exposure baking may be used in order to assist in the generating, dispersing, and reacting of the acid/base/free radical generated from the impingement of the radiation 45/97 upon the photoresist layer 15 during the exposure. Such assistance helps to create or enhance chemical reactions, which generate chemical differences between the exposed region 50 and the unexposed region 52 within the photoresist layer. These chemical differences also cause differences in the solubility between the exposed region 50 and the unexposed region 52. Heating at temperatures below the disclosed ranges or for less the than disclosed time duration may result in insufficient generation, dispersing, and reaction of the acid/base/free radical. Heating at temperatures above the disclosed range or for longer than the disclosed time duration may result in deleterious chemical reactions in the photoresist layer or may unnecessarily increase the cost and processing time of the semiconductor device.

The selectively exposed photoresist layer is subsequently developed by applying a developer to the selectively exposed photoresist layer in operation S150. As shown in FIG. 4, a developer 57 is supplied from a dispenser 62 to the photoresist layer 15. In some embodiments, the exposed portion of the photoresist layer 50 is removed by the developer 57 forming a pattern of openings 55 in the photoresist layer 15 to expose the substrate 10. The developed photoresist layer 15 then undergoes a hard baking (or third baking) operation S160 to crosslink the polymer in the remaining photoresist regions to form crosslinked polymer regions 52a, as shown in FIG. 5. In some embodiments, a wet cleaning or wet chemical treatment operation is performed on the substrate with the patterned photoresist layer at S170 after the hard baking operation S160.

In some embodiments, the pattern of openings 55 in the photoresist layer 15 are extended into the layer to be patterned or substrate 10 to create a pattern of openings 55' in the substrate 10, thereby transferring the pattern 55 in the photoresist layer into the substrate 10, as shown in FIG. 6. The pattern is extended into the substrate by etching, using one or more suitable etchants. The crosslinked photoresist layer 52a is at least partially removed during the etching operation in some embodiments. In other embodiments, the crosslinked photoresist layer 52a is removed after etching the substrate 10 by using a suitable photoresist stripper solvent or by a photoresist ashing operation.

In some embodiments, the substrate includes a semiconductor wafer. In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresists are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. In some embodiments, the photoresist is a positive tone resist, and the developer is an aqueous-based developer, such as a tetramethylammonium hydroxide (TMAH) solution.

In some embodiments, the photoresist layer includes a high sensitivity photoresist composition. In some embodiments, the high sensitivity photoresist composition is highly sensitive to extreme ultraviolet (EUV) radiation.

In some embodiments, the photoresist composition includes a polymer along with one or more photoactive compounds (PACs). In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, hydroxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

Figure 7A:
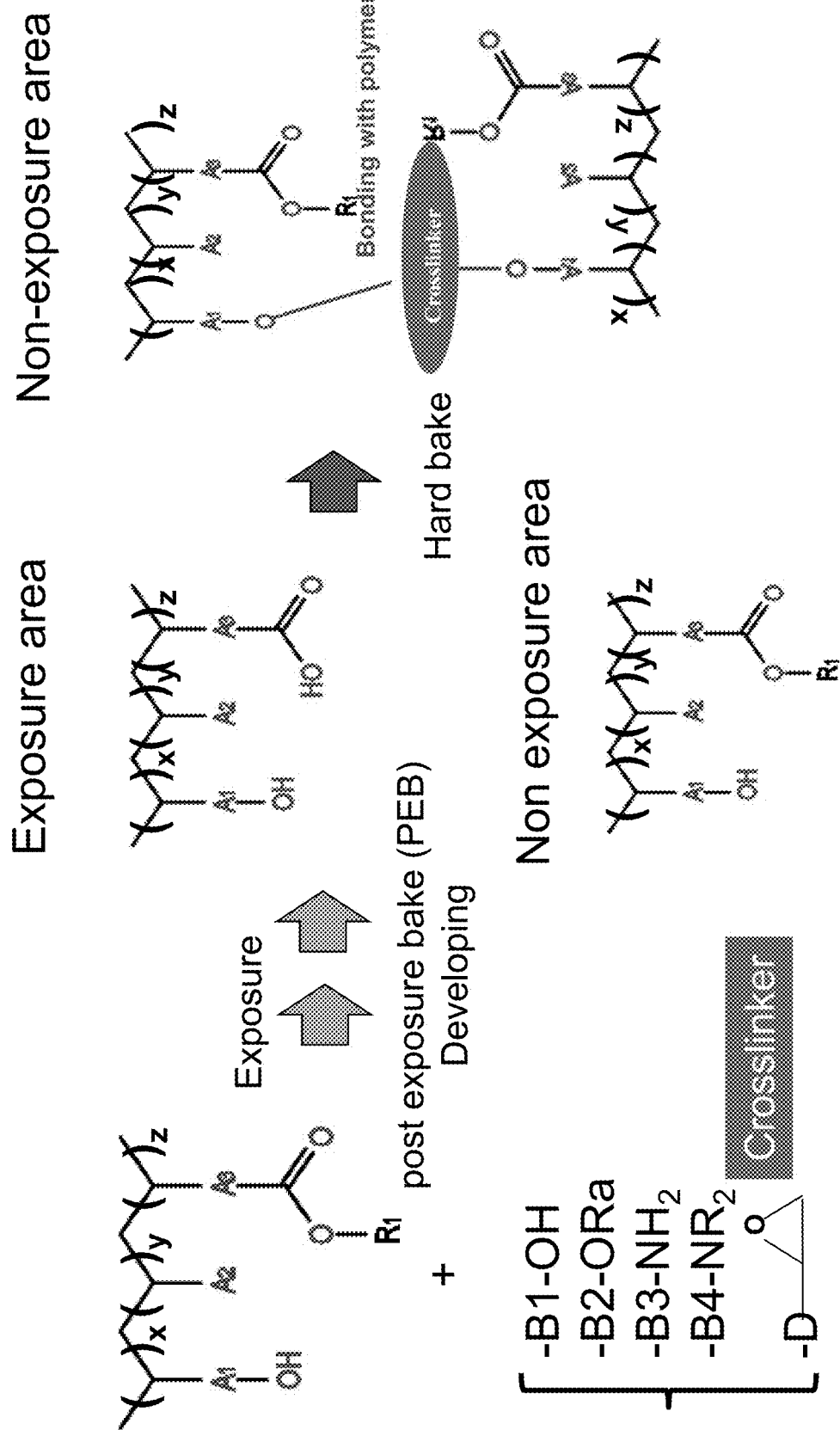
FIG. 7A shows a process flow according to embodiments of the disclosure.

A process flow showing the reactions that occur in the photoresist layer 15 caused by the exposure operation S130, developing operation S150, and baking operations S140, S160 is shown in FIG. 7A. In some embodiments, the polymer composition includes a photoactive compound, a polymer, and a crosslinker, wherein the polymer has a structure

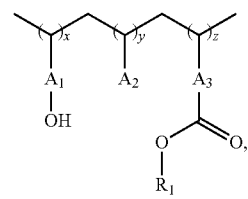

wherein A1, A2, and A3 are each independently a substituted or unsubstituted C6-C30 aryl group, C1-C30 alkyl group, C3-C30 cycloalkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; wherein R1 is a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group; wherein a proportion of x, y, and z in the polymer is 0≤x/(x+y+z)≤1, 0≤y/(x+y+z)≤1, and 0≤z/(x+y+z)≤1, and x, y, and z are all not 0 for a same polymer. The crosslinker is a monomer, oligomer, or polymer including one or more of the structures selected from

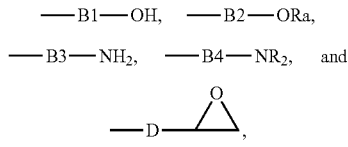

wherein B1, B2, B3, B4, and D are each independently a substituted or unsubstituted C6-C30 aryl group, C1-C30 alkyl group, C3-C30 cycloalkyl group, C2-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; and wherein R and Ra are each independently a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group. Each of the above groups may be substituted with one or more substituents, including a halogen, such as a fluoro, chloro, bromo, or iodo group; or an amino group. In some embodiments, the C6-C30 aryl group in the polymer or crosslinker includes benzyl groups; phenyl groups; or fused aryl groups, including naphthalenyl, and anthracenyl groups. In some embodiments, the 3-D structure includes adamantyl groups or norbornenyl groups. In some embodiments, the crosslinker includes epoxy or amino groups.

In some embodiments, R1 of the polymer is an acid labile group selected from the group consisting of

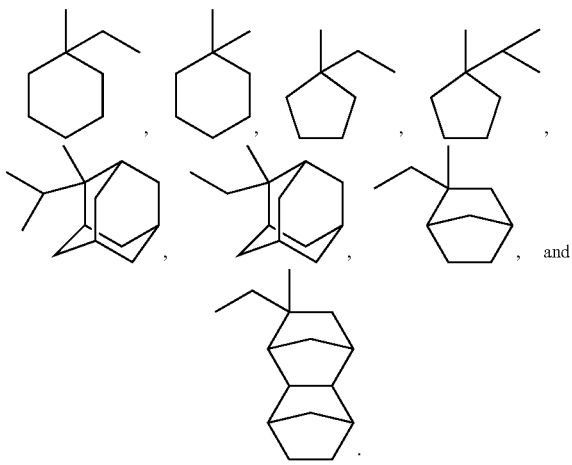

The exposure to actinic radiation causes the R1 group on the polymer in the exposed areas to decompose and form a developer soluble group, such as a carboxyl group (COOH) as shown in FIG. 7A. The exposed areas of the photoresist layer, being soluble in the developer are removed during the developing operation. The remaining non-exposed areas are subsequently crosslinked during the hard baking operation by the crosslinker, as shown in FIG. 7A. The patterned crosslinked photoresist layer 52a imparts improved etch resistance over photoresists that do not undergo the hard baking operation in some embodiments.

Figure 7B:
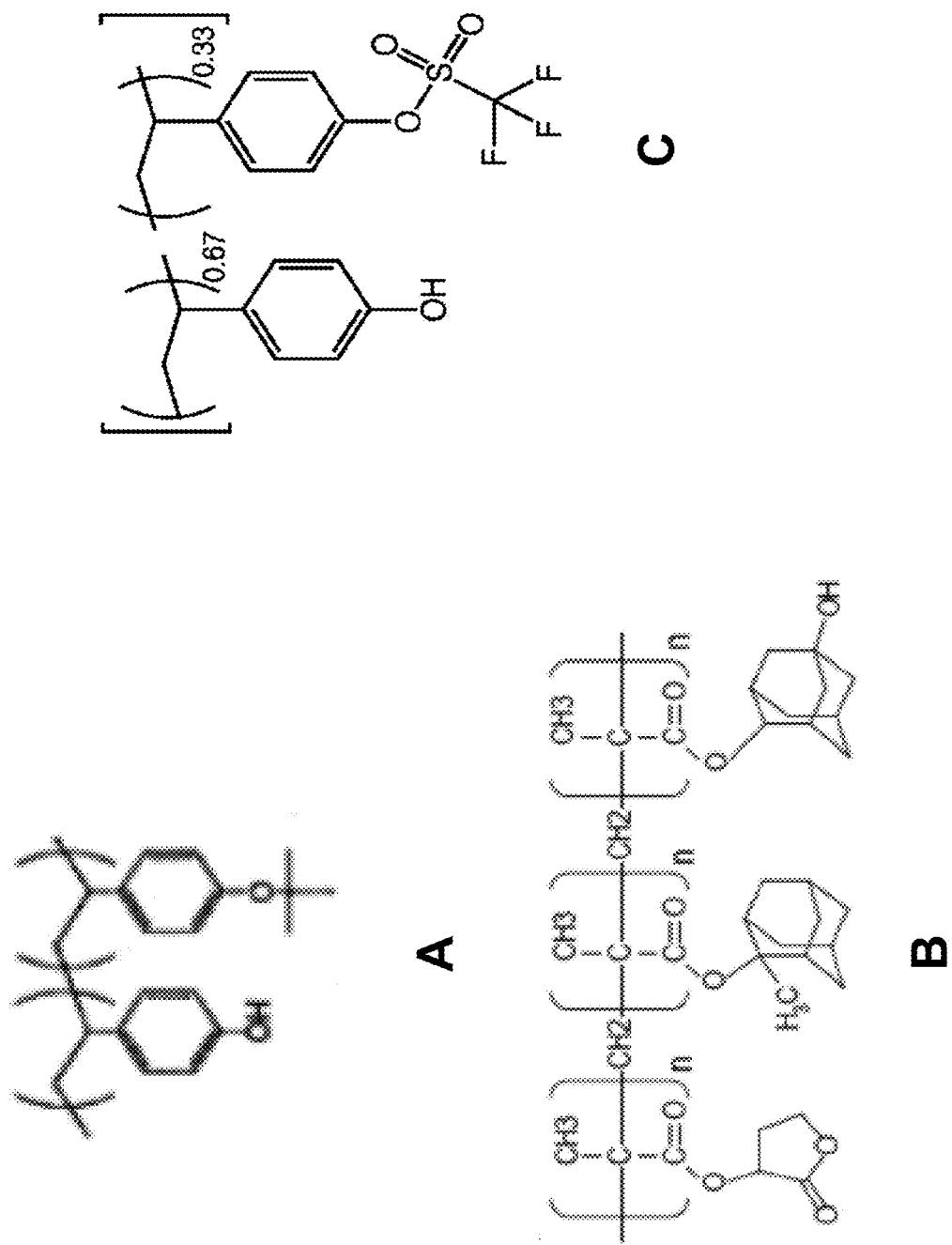
FIG. 7B shows examples of photoresist composition polymers according to embodiments of the disclosure.

Some examples of photoresist polymers are shown in FIG. 7B. Polymer A in FIG. 7B is used in photoresists photosensitive to KrF laser radiation in some embodiments, polymer B is used in photoresists photosensitive to ArF laser radiation in some embodiments, and polymer C is used in photoresists photosensitive to EUV radiation in other embodiments.

The acid labile group is attached to the hydrocarbon structure so that it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl) methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, such as when EUV radiation is used, the photoresist compositions according to the present disclosure are metal-containing resists. The metal-containing resists include metallic cores complexed with one or more ligands in a solvent. In some embodiments, the resist includes metal particles. In some embodiments, the metal particles are nanoparticles. As used herein, nanoparticles are particles having an average particle size between about 1 nm and about 20 nm. In some embodiments, the metallic cores, including from 1 to about 18 metal particles, are complexed with one or more organic ligands in a solvent. In some embodiments, the metallic cores include 3, 6, 9, or more metal nanoparticles complexed with one or more organic ligands in a solvent.

In some embodiments, the metal particle is one or more of titanium (Ti), zinc (Zn), zirconium (Zr), nickel (Ni), cobalt (Co), manganese (Mn), copper (Cu), iron (Fe), strontium (Sr), tungsten (W), vanadium (V), chromium (Cr), tin (Sn), hafnium (Hf), indium (In), cadmium (Cd), molybdenum (Mo), tantalum (Ta), niobium (Nb), aluminum (Al), cesium (Cs), barium (Ba), lanthanum (La), cerium (Ce), silver (Ag), antimony (Sb), combinations thereof, or oxides thereof. In some embodiments, the metal particles include one or more selected from the group consisting of Ba, La, Ce, In, Sn, Ag, Sb, and oxides thereof.

In some embodiments, the metal nanoparticles have an average particle size between about 2 nm and about 5 nm. In some embodiments, the amount of metal nanoparticles in the resist composition ranges from about 0.5 wt. % to about 15 wt. % based on the weight of the nanoparticles and the solvent. In some embodiments, the amount of nanoparticles in the resist composition ranges from about 5 wt. % to about 10 wt. % based on the weight of the nanoparticles and the solvent. In some embodiments, the concentration of the metal particles ranges from 1 wt. % to 7 wt. % based on the weight of the solvent and the metal particles. Below about 0.5 wt. % metal nanoparticles, the resist coating is too thin. Above about 15 wt. % metal nanoparticles, the resist coating is too thick and viscous.

In some embodiments, the metallic core is complexed by a thermally stable ligand, wherein the thermally stable ligand includes branched or unbranched, cyclic or noncyclic, saturated organic groups, including C1-C7 alkyl groups or C1-C7 fluoroalkyl groups. The C1-C7 alkyl groups or C1-C7 fluoroalkyl groups include one or more substituents selected from the group consisting of —CF$_3$, —SH, —OH, =O, —S—, —P—, —PO$_2$, —C(=O)SH, —C(=O)OH, —C(=O)O—, —O—, —N—, —C(=O)NH, —SO$_2$OH, —SO$_2$SH, —SOH, and —SO$_2$—. In some embodiments, the ligand includes one or more substituents selected from the group consisting of —CF$_3$, —OH, —SH, and —C(=O)OH substituents.

In some embodiments, the ligand is a carboxylic acid or sulfonic acid ligand. For example, in some embodiments, the ligand is a methacrylic acid. In some embodiments, the metal particles are nanoparticles, and the metal nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, each metal particle is complexed by 1 to 25 ligand units. In some embodiments, each metal particle is complexed by 3 to 18 ligand units.

In some embodiments, the resist composition includes about 0.1 wt. % to about 20 wt. % of the ligands based on the total weight of the resist composition. In some embodiments, the resist includes about 1 wt. % to about 10 wt. % of the ligands. In some embodiments, the ligand concentration is about 10 wt. % to about 40 wt. % based on the weight of the metal particles and the weight of the ligands. Below about 10 wt. % ligand, the organometallic photoresist does not function well. Above about 40 wt. % ligand, it is difficult to form a consistent photoresist layer. In some embodiments, the ligand(s) is dissolved at about a 5 wt. % to about 10 wt. % weight range in a coating solvent, such as propylene glycol methyl ether acetate (PGMEA) based on the weight of the ligand(s) and the solvent.

In some embodiments, the copolymers and the PACs, along with any desired additives or other agents, are added to the solvent for application. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

The solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), 7-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

In some embodiments, the photoresist composition further includes water at a concentration of 10 ppm to 250 ppm based on the total composition of the water and the first solvent.

In some embodiments, the polymer also includes other groups attached to the hydrocarbon structure that help to improve a variety of properties of the polymer. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (meth)acrylate, combinations of these, or the like.

Some embodiments of the photoresist include one or more photoactive compounds (PACs). The PACs are photoactive components, such as photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, oxime sulfonate, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer; combinations of these, or the like.

In some embodiments, the PAC includes photobase generators (PBG) and photo decomposable bases (PDB). In embodiments in which the PACs are photobase generators (PBG), the PBGs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

In some embodiments in which the PACs are photo decomposable bases (PBD), the PBDs include triphenylsulfonium hydroxide, triphenylsulfonium antimony hexafluoride, and triphenylsulfonium trifyl.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

Alternatively, instead of or in addition to the crosslinker agent being added to the photoresist composition, a coupling reagent is added in some embodiments, in which the coupling reagent is added in addition to the crosslinker. The coupling reagent assists the crosslinker reaction by reacting with the groups on the hydrocarbon structure in the polymer before the crosslinker reagent, allowing for a reduction in the reaction energy of the cross-linking reaction and an increase in the rate of reaction. The bonded coupling reagent then reacts with the crosslinker, thereby coupling the crosslinker to the polymer.

The individual components of the photoresist are placed into a solvent in order to aid in the mixing and dispensing of the photoresist. To aid in the mixing and dispensing of the photoresist, the solvent is chosen at least in part based upon the materials chosen for the polymer as well as the PACs. In some embodiments, the solvent is chosen such that the polymer and the PACs can be evenly dissolved into the solvent and dispensed upon the layer to be patterned.

In some embodiments, the photoresist composition includes a quencher. The quencher is added to some embodiments of the photoresist composition to inhibit diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and arylammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2', 4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

In some embodiments, the polymer and the PACs, along with any desired additives or other agents, are added to the solvent for application. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

Once ready, the photoresist is applied onto the layer to be patterned, as shown in FIG. 2, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like.

After the photoresist layer 15 has been applied to the substrate 10 in operation S110, a pre-exposure bake of the photoresist layer is performed in operation S120, in some embodiments, to cure and dry the photoresist prior to radiation exposure (see FIG. 1). The curing and drying of the photoresist layer 15 removes the solvent component while leaving behind the polymer, the PACs, the crosslinker, and the other chosen additives. In some embodiments, the pre-exposure baking is performed at a temperature suitable to evaporate the solvent, such as between about 40° C. and 120° C., although the precise temperature depends upon the materials chosen for the photoresist. The pre-exposure baking is performed for a time sufficient to cure and dry the photoresist layer, such as between about 10 seconds to about 10 minutes.

FIGS. 3A and 3B illustrate selective exposures of the photoresist layer to form an exposed region 50 and an unexposed region 52. In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45/97, such as ultraviolet light, to the photoresist layer 15 in order to induce a reaction of the PACs, which in turn reacts with the polymer to chemically alter those regions of the photoresist layer to which the radiation 45/97 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In an embodiment, the patterned radiation 45/97 is extreme ultraviolet light having a 13.5 nm wavelength, the PAC is a photoacid generator, the group to be decomposed is a carboxylic acid group on the hydrocarbon structure, and a crosslinker agent is used. The patterned radiation 45/97 impinges upon the photoacid generator, and the photoacid generator absorbs the impinging patterned radiation 45/97. This absorption initiates the photoacid generator to generate a proton (e.g., a $H^+$ ion) within the photoresist layer 15. When the proton impacts the carboxylic acid group on the hydrocarbon structure, the proton reacts with the carboxylic acid group, chemically altering the carboxylic acid group and altering the properties of the polymer in general.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the photoresist layer 15 has been exposed to the exposure radiation 45/97, a post-exposure baking is performed in some embodiments to assist in the generating, dispersing, and reacting of the acid/base/free radical generated from the impingement of the radiation 45/97 upon the PACs during the exposure. Such thermal assistance helps to create or enhance chemical reactions, which generate chemical differences between the exposed region 50 and the unexposed region 52 within the photoresist layer 15. These chemical differences also cause differences in the solubility between the exposed region 50 and the unexposed region 52. In some embodiments, the post-exposure baking operation S140 occurs at temperatures ranging from about 50° C. to about 160° C. for a period of between about 20 seconds and about 120 seconds. In some embodiments, the post-exposure baking is performed at a temperature ranging from about 80° C. to about 100° C.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

In some embodiments, the photoresist is a positive tone resist, and during the development process, the developer 57 dissolves the radiation-exposed regions 50 of the positive tone resist, exposing the surface of the substrate 10, as shown in FIG. 5, and leaving behind well-defined unexposed photoresist regions 52.

After the developing operation S150, remaining developer is removed from the patterned photoresist covered substrate. The remaining developer is removed using a spin-dry process in some embodiments, although any suitable removal technique may be used. Then, the patterned photoresist undergoes a hard baking operation S160. During the hard baking operation, the crosslinker material in the remaining portions of the photoresist regions 52 crosslink, thereby increasing the molecular weight of the polymer in the remaining photoresist regions 52 to form a patterned crosslinked photoresist layer 52a. An example of the crosslinking is shown in FIG. 7A. The crosslinked polymer provides improved resistance to subsequent wet processing operations, such as wet cleaning and wet etching; and dry etching operations. The hard baking operation S160 is performed at a higher temperature than the post-exposure baking operation S140. In some embodiments, the hard baking operation S160 is performed at a temperature at least 10° C. higher than the post exposure baking operation S140. In some embodiments, the hard baking operation occurs at temperatures ranging from about 60° C. to about 200° C. for a period of between about 20 seconds and about 120 seconds. In some embodiments, the hard baking operation S160 is performed at a temperature ranging from about 90° C. to about 170° C. In some embodiments, the hard baking operation S160 is performed at a temperature ranging from about 100° C. to about 125° C. The specific hard baking temperature and duration depends on the specific crosslinker. The crosslinker is selected so that it does not cause crosslinking during the pre-exposure or post-exposure operations. Thus, the crosslinker is selected so that the crosslinking occurs at a higher temperature than the pre-exposure and post-exposure baking temperatures. Heating at temperatures below the disclosed ranges or for less the than disclosed time duration may result in insufficient crosslinking of the photoresist layer. Heating at temperatures above the disclosed range or for longer than the disclosed time duration may result in deleterious chemical reactions in the photoresist layer.

After the hard baking operation S160, additional processing is performed while the crosslinked photoresist layer 52a is in place. For example, a wet cleaning or wet chemical treatment operation S170 is performed in some embodiments. The crosslinked photoresist layer 52a is resistant to dissolution and degradation by the wet chemicals used in a cleaning operation or wet treatment, such as a wet etching operation. In some embodiments, wet or dry etching is performed on the substrate 10 or a layer to transfer the pattern of the crosslinked photoresist layer 52a to the underlying substrate 10, forming recesses 55" as shown in FIG. 6. The crosslinked photoresist layer 52a provides improved resistance to the etching operations. The substrate 10 has a different etch resistance than the crosslinked photoresist layer 52a. In some embodiments, the etchant is more selective to the substrate 10 than the crosslinked photoresist layer 52a.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 8:
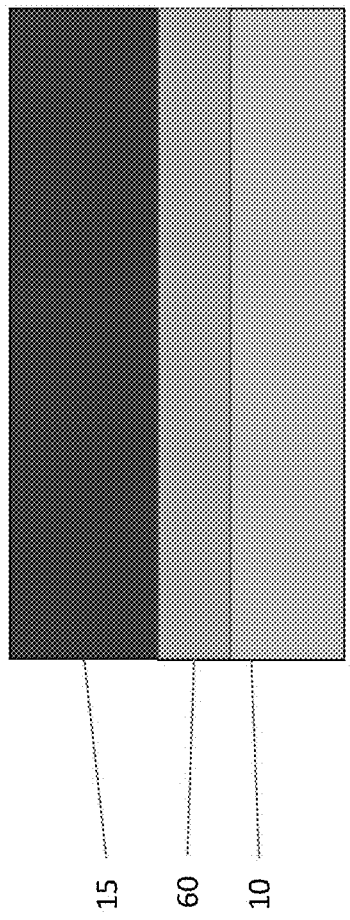
FIG. 8 shows a process stage of a sequential operation according to an embodiment of the disclosure.

In some embodiments, a layer to be patterned 60 is disposed over the substrate prior to forming the photoresist layer, as shown in FIG. 8. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 9A:
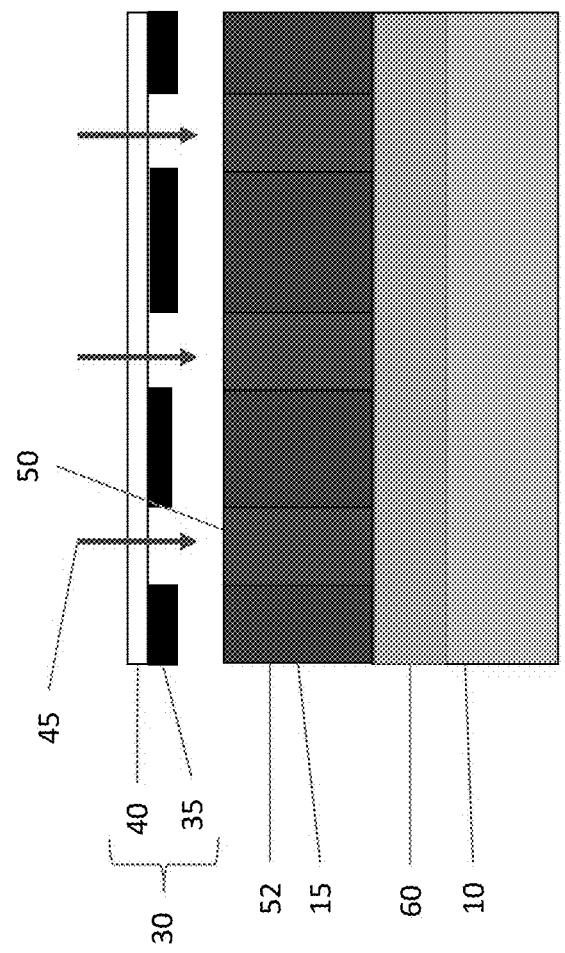
FIGS. 9A and 9B show a process stage of a sequential operation according to an embodiment of the disclosure.
Figure 9B:
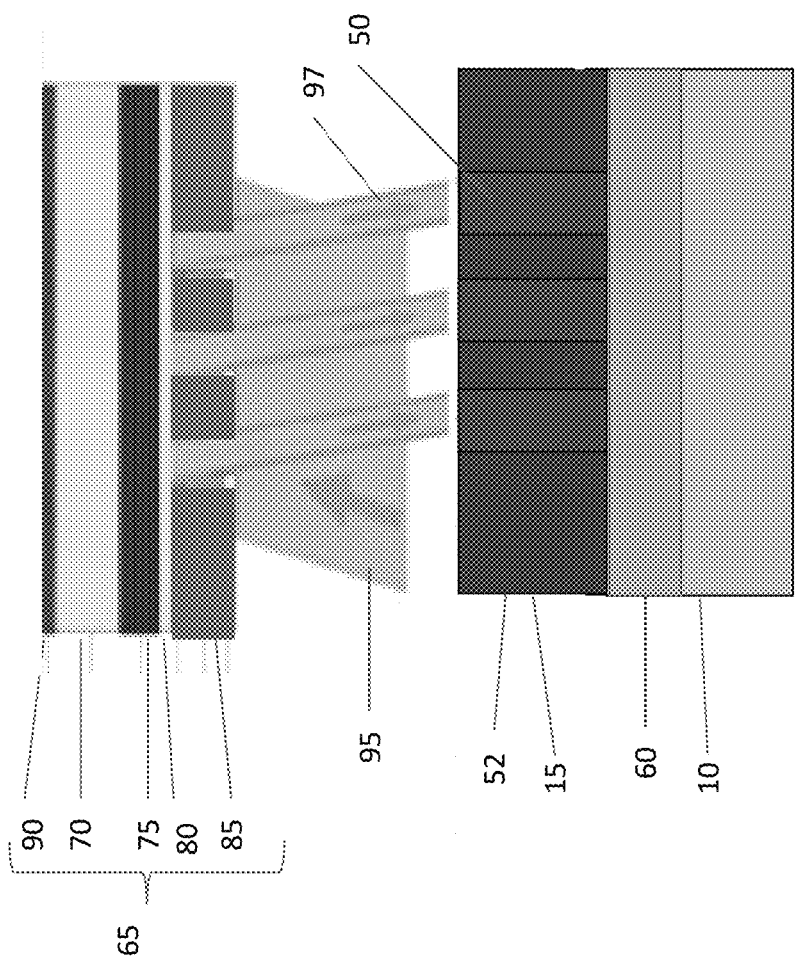

The photoresist layer 15 is subsequently selectively exposed to actinic radiation 45/97 to form exposed regions 50 and unexposed regions 52 in the photoresist layer, as shown in FIGS. 9A and 9B, and described herein in relation to FIGS. 3A and 3B.

Figure 10:
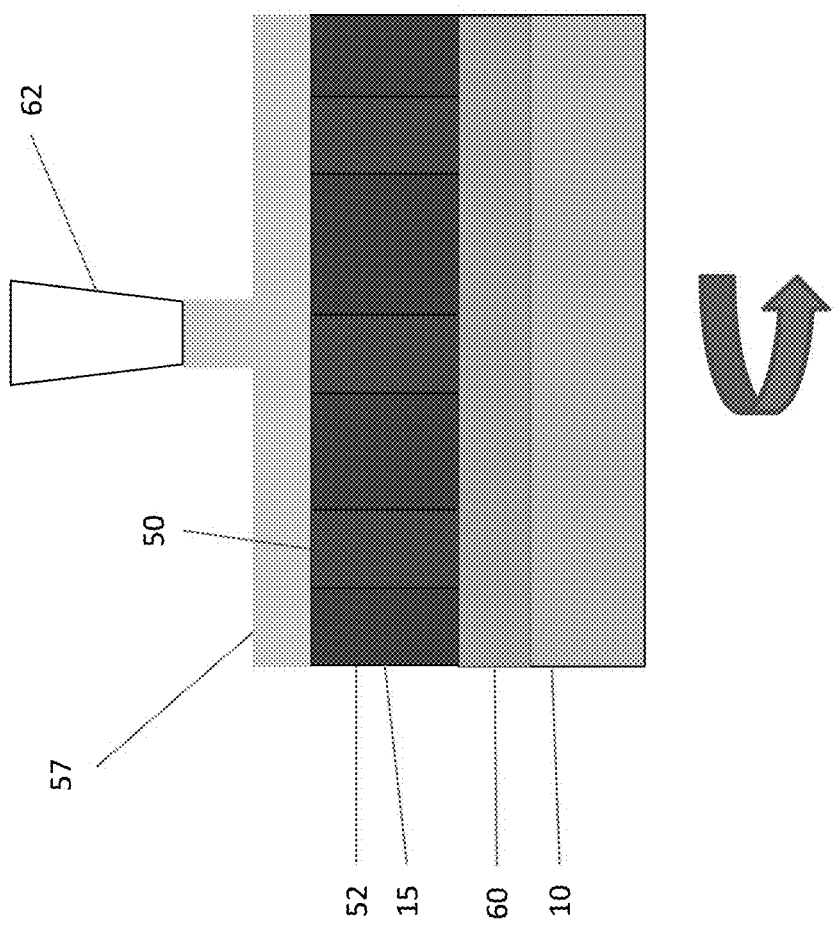
FIG. 10 shows a process stage of a sequential operation according to an embodiment of the disclosure.
Figure 11:
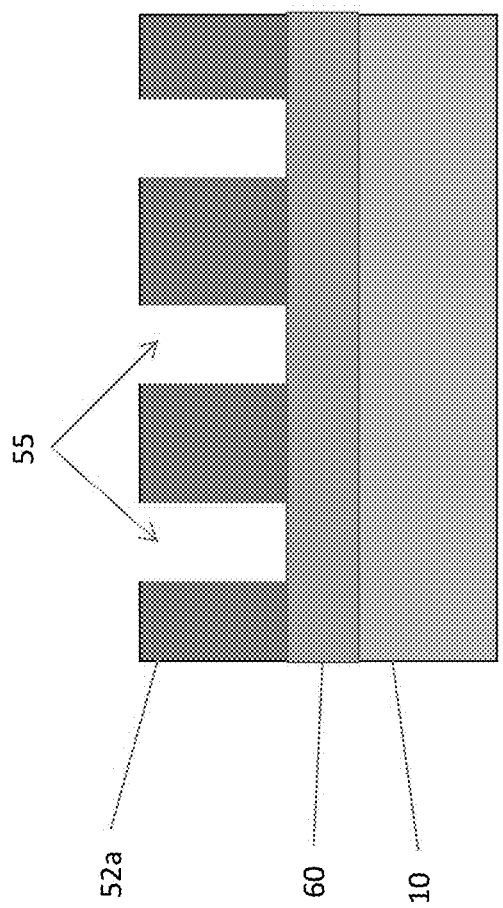
FIG. 11 shows a process stage of a sequential operation according to an embodiment of the disclosure.

As shown in FIG. 10, the exposed photoresist regions 50 are developed by dispensing developer 57 from a dispenser 62 to form a pattern of photoresist openings 55, as shown in FIG. 11. The development operation is similar to that explained with reference to FIGS. 4 and 5, herein.

After the developing operation, remaining developer is removed from the patterned photoresist covered substrate. The remaining developer is removed using a spin-dry process in some embodiments, although any suitable removal technique may be used. Then, the patterned photoresist undergoes a hard baking operation, as previously described.

Figure 12:
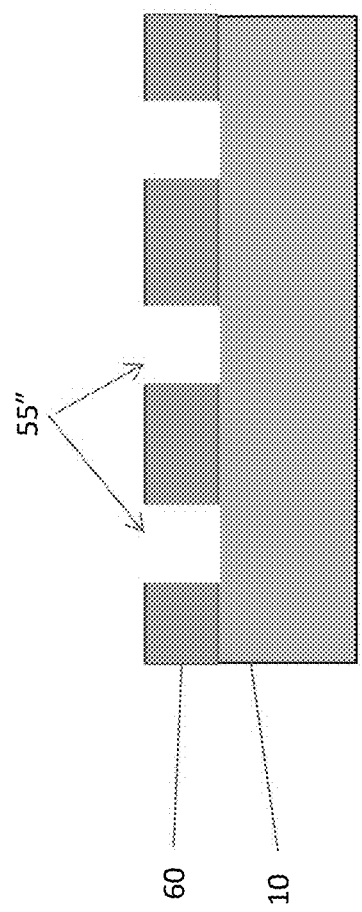
FIG. 12 shows a process stage of a sequential operation according to an embodiment of the disclosure.

Then as shown in FIG. 12, the pattern 55 in the cross-linked photoresist layer 52a is transferred to the layer to be patterned 60 using an etching operation and the photoresist layer is removed, as explained with reference to FIG. 6 to form pattern 55" in the layer to be patterned 60.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

The novel photoresist compositions and photolithographic patterning methods according to the present disclosure provide higher semiconductor device feature resolution and density at higher wafer exposure throughput with reduced defects in a higher efficiency process than conventional exposure techniques. The novel photoresist compositions provide improved solubility of the photoresist components in the photoresist composition.

Positive tone photoresists may have less than desirable resistance to the effects of wet semiconductor device manufacturing operations. Wet processing, such as cleaning or etching, using acid or bases may degrade the photoresist pattern. Photoresist compositions and semiconductor manufacturing methods according to the present disclosure provide improved photoresist resistance to wet manufacturing operations. Photoresist compositions and methods according to the present disclosure use a crosslinker that crosslinks the remaining photoresist after the developing operation. The crosslinked remaining portions of the photoresist provide improved resistance to the wet manufacturing operations. In addition, the crosslinked photoresist layer also provides improved dry etching resistance.

An embodiment of the disclosure is a method of manufacturing a semiconductor device, including forming a photoresist layer including a photoresist composition over a substrate. The photoresist layer is selectively exposed to actinic radiation to form a latent pattern. The latent pattern is developed by applying a developer to the selectively exposed photoresist layer to form a patterned photoresist layer. The photoresist composition includes: a photoactive compound, a polymer, and a crosslinker. The polymer has a structure

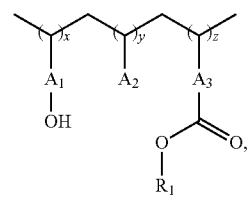

wherein A1, A2, and A3 are each independently a substituted or unsubstituted C6-C30 aryl group, C1-C30 alkyl group, C3-C30 cycloalkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; wherein R1 is a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group; wherein a proportion of x, y, and z in the polymer is $0 \leq x/(x+y+z) \leq 1$, $0 \leq y/(x+y+z) \leq 1$, and $0 \leq z/(x+y+z) \leq 1$, and x, y, and z are all not 0 for a same polymer. The crosslinker is a monomer, oligomer, or polymer having one or more of the structures selected from

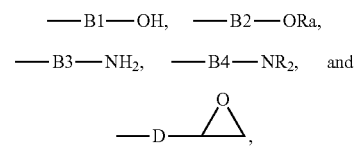

wherein B1, B2, B3, B4, and D are each independently a substituted or unsubstituted C6-C30 aryl group, C1-C30 alkyl group, C3-C30 cycloalkyl group, C2-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; and wherein R and Ra are each independently a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group. In an embodiment, the method includes after selectively exposing the photoresist layer to actinic radiation to form a latent pattern and before developing the latent pattern, heating the photoresist layer at a first temperature in a first heating operation. In an embodiment, the method includes after developing the latent pattern, heating the photoresist layer at a second temperature in a second heating operation to crosslink the polymer, wherein the second temperature is higher than the first temperature. In an embodiment, the second temperature is at least 10° C. higher than the first temperature. In an embodiment, the method includes performing a cleaning operation on the patterned photoresist layer and substrate. In an embodiment, the cleaning operation includes applying a liquid chemical to the patterned photoresist layer and substrate. In an embodiment, R1 is an acid labile group selected from one or more of

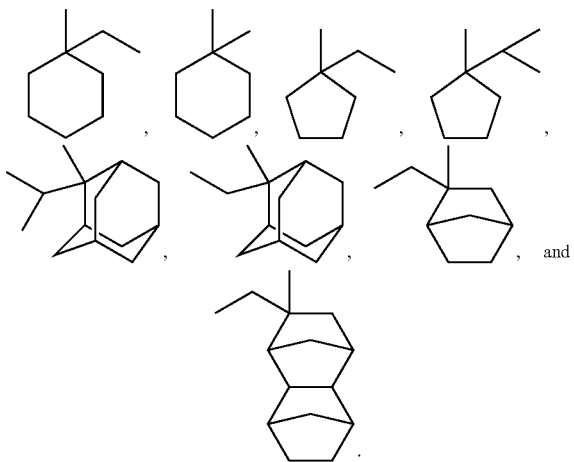

In an embodiment, the actinic radiation is extreme ultraviolet radiation or an electron beam.

Another embodiment of the disclosure is a method of manufacturing a semiconductor device, including forming a photoresist layer including a photoresist composition over a semiconductor wafer. The photoresist composition includes a polymer and a crosslinker. The photoresist layer is patternwise exposed to actinic radiation. The patternwise exposed photoresist layer is heated at a first temperature. Portions of the photoresist layer exposed to the actinic radiation are removed to form a patterned photoresist layer. The polymer in the patterned photoresist layer is crosslinked after the removing portions of the photoresist layer exposed to the actinic radiation. In an embodiment, the crosslinking the polymer in the patterned photoresist layer includes heating the patterned photoresist layer at a second temperature greater than the first temperature. In an embodiment, the second temperature is at least 10° C. greater than the first temperature. In an embodiment, the photoresist composition further includes a photoactive compound, and the polymer has a structure

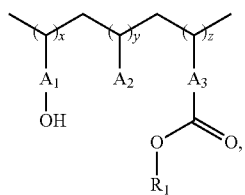

wherein A1, A2, and A3 are each independently a substituted or unsubstituted C6-C30 aryl group, C1-C30 alkyl group, C3-C30 cycloalkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; wherein R1 is a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group; wherein a proportion of x, y, and z in the polymer is $0 \le x/(x+y+z) \le 1$, $0 \le y/(x+y+z) \le 1$, and $0 \le z/(x+y+z) \le 1$, and x, y, and z are all not 0 for a same polymer. In an embodiment, the crosslinker is a monomer, oligomer, or polymer including one or more of the structures selected from

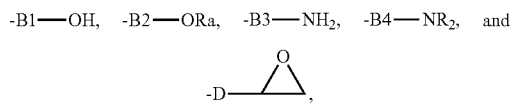

wherein B1, B2, B3, B4, and D are each independently a substituted or unsubstituted C6-C30 aryl group, C1-C30 alkyl group, C3-C30 cycloalkyl group, C2-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; and wherein R and Ra are each independently a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group. In an embodiment, the method includes performing a cleaning operation on the patterned photoresist layer and semiconductor wafer.

Another embodiment of the disclosure is a photoresist composition, including: a photoactive compound, a polymer, and a crosslinker. The polymer has a structure

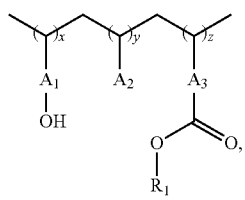

wherein A1, A2, and A3 are each independently a substituted or unsubstituted C6-C30 aryl group, C1-C30 alkyl group, C3-C30 cycloalkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; and wherein R1 is a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group; wherein a proportion of x, y, and z in the polymer is $0 \leq x/(x+y+z) \leq 1$, $0 \leq y/(x+y+z) \leq 1$, and $0 \leq z/(x+y+z) \leq 1$, and x, y, and z are all not 0 for a same polymer. The crosslinker is a monomer, oligomer, or polymer including one or more of the structures selected from

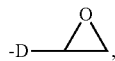

wherein B1, B2, B3, B4, and D are each independently a substituted or unsubstituted C6-C30 aryl group, C1-C30 alkyl group, C3-C30 cycloalkyl group, C2-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; and wherein R and Ra are each independently a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group. In an embodiment, R1 is an acid labile group selected from one or more of

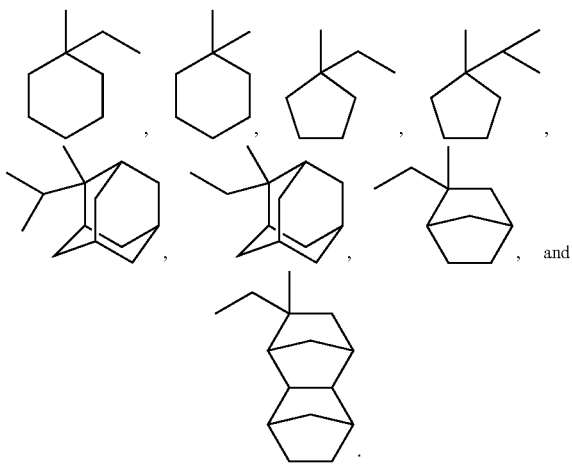

In an embodiment, the photoactive compound is a photoacid generator. In an embodiment, the photoresist composition includes a solvent. In an embodiment, the photoresist composition includes metal oxide nanoparticles and one or more organic ligands. In an embodiment, the photoresist composition the crosslinker includes one or more epoxy groups.

Another embodiment of the disclosure is a method of manufacturing a semiconductor device, including forming a photoresist layer including a photoresist composition over a substrate. The photoresist layer is patterned to form a patterned photoresist layer, and the patterned photoresist layer is heated at a first temperature sufficient to crosslink the patterned photoresist layer. The photoresist composition includes: a photoactive compound, a polymer, and a crosslinker. The polymer has a structure

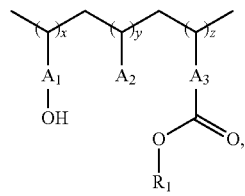

wherein A1, A2, and A3 are each independently a substituted or unsubstituted C6-C30 aryl group, C1-C30 alkyl group, C3-C30 cycloalkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; wherein R1 is a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group; and wherein a proportion of x, y, and z in the polymer is $0 \leq x/(x+y+z) \leq 1$, $0 \leq y/(x+y+z) \leq 1$, and $0 \leq z/(x+y+z) \leq 1$, and x, y, and z are all not 0 for a same polymer. The crosslinker is a monomer, oligomer, or polymer including one or more of the structures selected from

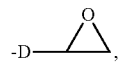

wherein B1, B2, B3, B4, and D are each independently a substituted or unsubstituted C6-C30 aryl group, C1-C30 alkyl group, C3-C30 cycloalkyl group, C2-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure; and wherein R and Ra are each independently a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group. In an embodiment, the method includes extending a pattern defined by the patterned photoresist layer into the substrate. In an embodiment, the extending a pattern includes etching the substrate. In an embodiment, the patterning the photoresist layer includes: patternwise exposing the photoresist layer to actinic radiation, heating the patternwise exposed photoresist layer at second temperature, wherein the second temperature is lower than the first temperature, and developing the patternwise exposed photoresist layer after the heating the patternwise exposed photoresist layer. In an embodiment, the actinic radiation is extreme ultraviolet radiation or an electron beam. In an embodiment, the method includes heating the photoresist layer at a third temperature before the patterning the photoresist layer, wherein the third temperature is lower than the first temperature.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a photoresist layer comprising a photoresist composition over a substrate;
   selectively exposing the photoresist layer to actinic radiation to form a latent pattern; and
   developing the latent pattern by applying a developer to the selectively exposed photoresist layer to form a patterned photoresist layer,
   wherein the photoresist composition comprises:
   a photoactive compound;
   a polymer; and
   a crosslinker,
   wherein the polymer has a structure

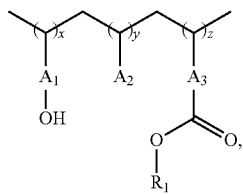

wherein $A_1$ and $A_2$ are independently a substituted or unsubstituted C6-C30 aryl group, C1-C30 alkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C1-C30 heterocyclic group, or C1-C30 chain,
   wherein $A_3$ is a substituted or unsubstituted C1-C30 alkyl group, C1-C30 hydroxylalkyl group, C2-C30 alkoxy group, C3-C30 alkoxyl alkyl group, C2-C30 acetyl group, C3-C30 acetylalkyl group, C4-C30 cycloalkyl carboxyl group, saturated or unsaturated C1-C30 heterocyclic group, or C1-C30 chain,
   wherein $R_1$ is a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group,
   wherein a proportion of x, y, and z in the polymer is $0<x/(x+y+z)<1$, $0<y/(x+y+z)<1$, and $0<z/(x+y+z)<1$,
   wherein the crosslinker is a monomer, oligomer, or polymer including one or more of the structures selected from -B1—OH, -B2—ORa, -B3—NH$_2$, -B4—NR$_2$, and

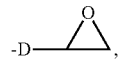

wherein B1, B2, B3, B4, and D are each independently a substituted or unsubstituted C6-C30 aryl group, C1-C30 alkyl group, C3-C30 cycloalkyl group, C2-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure, and
   wherein R and Ra are each independently a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group.

2. The method according to claim 1, further comprising after selectively exposing the photoresist layer to actinic radiation to form the latent pattern and before developing the latent pattern, heating the photoresist layer at a first temperature in a first heating operation.

3. The method according to claim 2, further comprising after developing the latent pattern, heating the photoresist layer at a second temperature in a second heating operation to crosslink the polymer, wherein the second temperature is higher than the first temperature.

4. The method according to claim 3, wherein the second temperature is at least 10° C. higher than the first temperature.

5. The method according to claim 3, further performing a cleaning operation on the patterned photoresist layer and the substrate.

6. The method according to claim 5, wherein the cleaning operation includes applying a liquid chemical to the patterned photoresist layer and the substrate.

7. The method according to claim 1, wherein $R_1$ is an acid labile group selected from one or more of

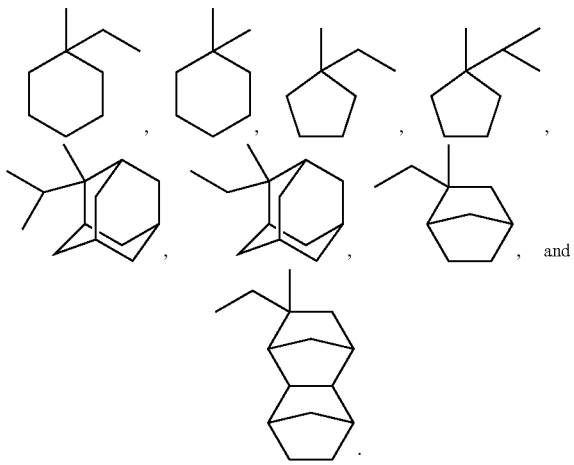

8. The method according to claim 1, wherein the actinic radiation is extreme ultraviolet radiation.

9. A method of manufacturing a semiconductor device, comprising:
forming a photoresist layer comprising a photoresist composition over a semiconductor wafer,
wherein the photoresist composition comprises a polymer and a crosslinker;
patternwise exposing the photoresist layer to actinic radiation;
heating the patternwise exposed photoresist layer at a first temperature;
removing portions of the photoresist layer exposed to the actinic radiation to form a patterned photoresist layer; and
crosslinking the polymer in the patterned photoresist layer after the removing portions of the photoresist layer exposed to the actinic radiation,
wherein the polymer has a structure

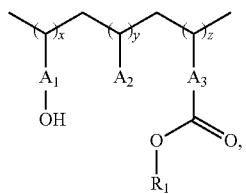

wherein $A_1$ is a substituted or unsubstituted C1-C30 alkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C1-C30 heterocyclic group, or C1-C30 chain,
wherein $A_2$ and $A_3$ are each independently a substituted or unsubstituted C6-C30 aryl group, C1-C30 alkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C1-C30 heterocyclic group, or C1-C30 chain,
wherein $R_1$ is a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group,
wherein a proportion of x, y, and z in the polymer is $0<x/(x+y+z)<1$, $0<y/(x+y+z)<1$, and $0<z/(x+y+z)<1$.

10. The method according to claim 9, wherein the crosslinking the polymer in the patterned photoresist layer includes heating the patterned photoresist layer at a second temperature greater than the first temperature.

11. The method according to claim 10, wherein the second temperature is at least 10° C. greater than the first temperature.

12. The method according to claim 9, wherein the crosslinker is a monomer, oligomer, or polymer including one or more of the structures selected from -B1—OH, -B2—ORa, -B3—NH$_2$, -B4—NR$_2$, and

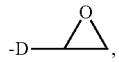

wherein B1, B2, B3, B4, and D are each independently a substituted or unsubstituted C6-C30 aryl group, C1-C30 alkyl group, C3-C30 cycloalkyl group, C2-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, saturated or unsaturated C1-C30 heterocyclic group, or C1-C30 chain, ring, or 3-D structure, and
wherein R and Ra are each independently a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group.

13. The method according to claim 9, further performing a cleaning operation on the patterned photoresist layer and the semiconductor wafer.

14. A method of manufacturing a semiconductor device, comprising:
forming a photoresist layer comprising a photoresist composition over a substrate;
patterning the photoresist layer to form a patterned photoresist layer; and
heating the patterned photoresist layer at a first temperature sufficient to crosslink the patterned photoresist layer,
wherein the photoresist composition comprises:
a photoactive compound;
a polymer; and
a crosslinker,
wherein the polymer has a structure

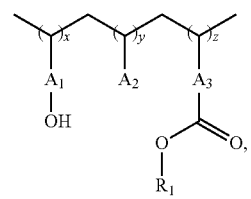

wherein $A_1$ and $A_2$ are each independently a substituted or unsubstituted C1-C30 alkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C1-C30 heterocyclic group, or C1-C30 chain,
wherein $A_3$ is a substituted or unsubstituted C1-C30 alkyl group, C1-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C1-C30 heterocyclic group, or C1-C30 chain,
wherein $R_1$ is a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group,
wherein a proportion of x, y, and z in the polymer is $0<x/(x+y+z)<1$, $0<y/(x+y+z)<1$, and $0<z/(x+y+z)<1$, wherein the crosslinker is a monomer, oligomer, or polymer including one or more of the structures selected from -B1—OH, -B2—ORa, -B3—NH₂, -B4—NR₂, and

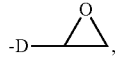, wherein B1, B2, B3, B4, and D are each independently a substituted or unsubstituted C6-C30 aryl group, C1-C30 alkyl group, C3-C30 cycloalkyl group, C2-C30 hydroxylalkyl group, C2-C30 alkoxy group, C3-C30 alkoxyl alkyl group, C2-C30 acetyl group, C3-C30 acetylalkyl group, C1-C30 carboxyl group, C2-C30 alkyl carboxyl group, C4-C30 cycloalkyl carboxyl group, saturated or unsaturated C3-C30 hydrocarbon ring, a saturated or unsaturated C1-C30 heterocyclic group, or C1-C30 chain, ring, or 3-D structure, and wherein R and Ra are each independently a substituted or unsubstituted C4-C15 chain, cyclic, or 3-D structure alkyl group, C4-C15 cycloalkyl group, C4-C15 hydroxylalkyl group, C4-C15 alkoxy group, or C4-C15 alkoxyl alkyl group.

15. The method according to claim 14, further comprising extending a pattern defined by the patterned photoresist layer into the substrate.

16. The method according to claim 15, wherein the extending a pattern comprises etching the substrate.

17. The method according to claim 14, wherein the patterning the photoresist layer comprises:
patternwise exposing the photoresist layer to actinic radiation;
heating the patternwise exposed photoresist layer at second temperature,
wherein the second temperature is lower than the first temperature; and
developing the patternwise exposed photoresist layer after the heating the patternwise exposed photoresist layer.

18. The method according to claim 17, wherein the actinic radiation is extreme ultraviolet radiation or an electron beam.

19. The method according to claim 14, further comprising heating the photoresist layer at a third temperature before the patterning the photoresist layer,
wherein the third temperature is lower than the first temperature.

20. The method according to claim 9, further comprising heating the photoresist layer at a third temperature before the patterning the photoresist layer,
wherein the third temperature is lower than the first temperature.

* * * * *